United States Patent [19]
Derbyshire et al.

[11] Patent Number: 5,947,900
[45] Date of Patent: Sep. 7, 1999

[54] DYNAMIC SCAN PLANE TRACKING USING MR POSITION MONITORING

[75] Inventors: John A. Derbyshire, Toronto, Canada; R. Scott Hinks, Wexford, Pa.; Graham A. Wright; Ross M. Henkelman, both of Toronto, Canada

[73] Assignee: General Electric Company, Milwaukee, Wis.

[21] Appl. No.: 09/059,152

[22] Filed: Apr. 13, 1998

[51] Int. Cl.⁶ .................................................. A61B 5/055
[52] U.S. Cl. ........................... 600/410; 600/422; 324/309
[58] Field of Search ................................. 600/410, 414, 600/421, 422, 595; 324/309, 318, 322, 307, 312

[56] References Cited

U.S. PATENT DOCUMENTS

| | | | |
|---|---|---|---|
| 5,515,863 | 5/1996 | Damadian | 600/420 |
| 5,539,312 | 7/1996 | Fu et al. | 324/309 |
| 5,617,857 | 4/1997 | Chader et al. | 128/653.1 |
| 5,622,170 | 4/1997 | Schulz | 128/653.1 |
| 5,680,862 | 10/1997 | Song et al. | 600/410 |
| 5,715,822 | 2/1998 | Watkins et al. | 128/653.5 |
| 5,810,728 | 9/1998 | Kuhn | 600/410 |

*Primary Examiner*—Ruth S. Smith
*Attorney, Agent, or Firm*—Barry E. Sammons; Christian G. Cabou; Phyllis Y. Price

[57] ABSTRACT

An MRI system measures the movements of a subject during the acquisition of a series of NMR images and automatically updates the scan parameters such that the image plane or volume tracks the movement of the anatomy of interest. An array of tracking coils fasten to the subject and an NMR measurement pulse sequence is interleaved with the image acquisitions to measure the location of the tracking cols.

7 Claims, 3 Drawing Sheets

DYNAMIC SCAN PLANE TRACKING USING MR POSITION MONITORING

BACKGROUND OF THE INVENTION

The field of the invention is nuclear magnetic resonance imaging (MRI) methods and systems. More particularly, the invention relates to the imaging of moving objects.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$, $G_y$, and $G_z$) are employed. Typically, the region to be imaged is scanned by a sequence of measurement cycles, or "views", in which these gradients vary according to the particular localization method being used. The resulting set of received NMR signals are digitized and processed to reconstruct the image using one of many well known reconstruction techniques.

Many magnetic resonance imaging studies require the sequential acquisition of multiple images from the same region of interest in the imaged subject. Pixel-by-pixel data analysis of such images customarily assumes that corresponding pixels in different images represent the same location in the subject. Patient motion is a significant problem and can be a serious source of error in these quantitative procedures. Image registration post-processing schemes can be useful to correct for in-plane motion and navigator echoes can provide additional information regarding translational and/or rotational motion to assist with image registration. These methods are, however, unable to correct for translations and/or rotations of the region of interest out of the imaging volume.

One example of such procedures is intra-operative imaging. Intra-operative MR imaging is employed during a medical procedure to assist the doctor in guiding an instrument. For example, during a needle biopsy the MRI system is operated in a realtime mode in which image frames are produced at a high rate so that the doctor can monitor the location of the needle as it is inserted. A locator device such as that described in U.S. Pat. Nos. 5,622,170 and 5,617,857 may be used to track the location of the instrument and provide coordinate values to the MRI system which enable it to mark the location of the instrument in each reconstructed image. The medical instrument is attached to a handpiece that is manipulated by the physician and whose position is detected by surrounding sensors. For example, the handpiece may emit light from two or more light emitting diodes which is sensed by three stationary cameras.

Tracking devices which employ the MRI system to locate markers in the patient have also been developed. As described in U.S. Pat. No. 5,715,822, such tracking systems employ a small coil attached to a catheter or other medical device to be tracked. An MRI pulse sequence is performed using the tracking coil to produce transverse magnetization at the location of the tracked device. The location of the tracking coil is determined and is superimposed at the corresponding location in a medical image acquired with the same MRI system

SUMMARY OF THE INVENTION

The present invention is a method for changing the location and orientation of an imaged slice or volume during the acquisition of a series of MRI images in order to acquire each image from the same region of interest in a moving subject. More particularly, the method includes placing an array of tracking coils on the subject to be imaged; measuring the location of the tracking coils using an NMR measuring pulse sequence; acquiring an image using an NMR imaging pulse sequence which has been prescribed by a set of scan parameters; measuring the location of the tracking coils using the NMR measuring pulse sequence; updating the set of scan parameters to track movement of the subject as determined by the location of the tracking coils; and acquiring a further image using the NMR imaging pulse sequence with the set of updated scan parameters.

A general object of the invention is to track patient movement during a procedure in which a series of NMR images are acquired. The NMR measurement pulse sequences are interleaved with the image acquisitions and used to measure patient movement during the procedure by acquiring NMR signals from the array of tracking coils securely fastened to the patient. The detected movements are used to update the scan parameters used by the MRI system such that the imaged region of interest moves with the patient and accurately tracks the anatomy of interest in the procedure being performed.

DESCRIPTION OF THE PREFERRED EMBODIMENT

Figure 1:
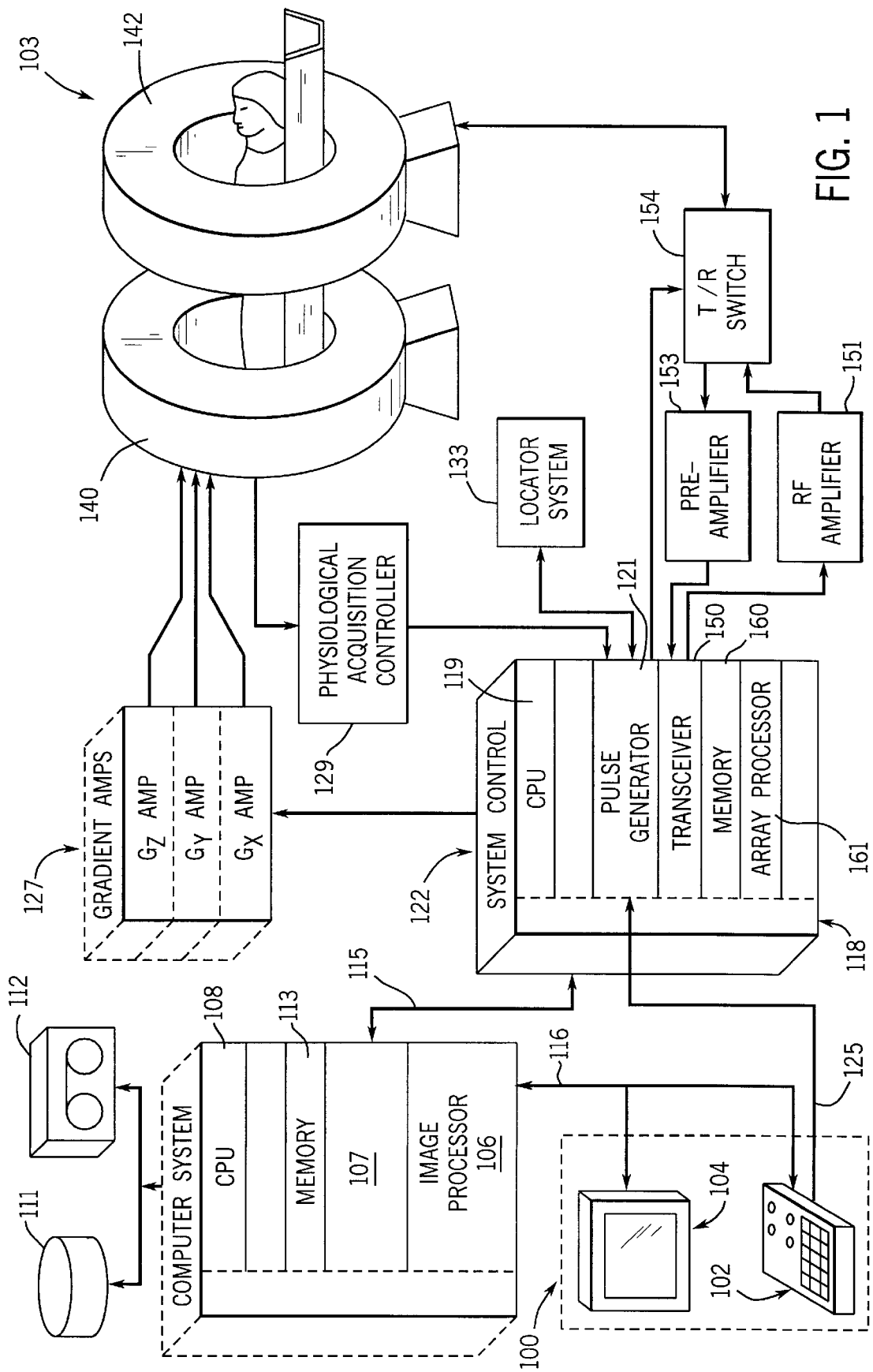
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. A separate display (not shown) is also located near the magnet system 103 so that they are available to a physician attending the subject of an MRI scan. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a locator system 133. As is described in more detail below, this locator system 133 is employed by the pulse generator module 121 to change position and/or orientation of the slice acquisition to track the region of interest in the patient.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in the magnet system 103 to produce the magnetic field gradients used for position encoding acquired signals. A transceiver module 150 in the system control 122 produces pulses which are amplified by an RF amplifier 151 and coupled to an RF coil in the magnet assembly 103 by a transmit/receive switch 154. The resulting signals radiated by the excited nuclei in the patient may be sensed by the same RF coil and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the RF coil during the transmit mode and to connect the preamplifier 153 during the receive mode. The transmit/receive switch 154 also enables a separate RF coil (for example, a head coil or surface coil) to be used in either the transmit or receive mode. In the preferred embodiment the receiver has four separate channels and this switch is employed to connect three separate RF tracking coils to three receiver channels and connect one local imaging coil to fourth the receiver channel. A four-channel receiver used for phased array coils is employed so that all four signals can be received during a scan, however, it is also possible to use a single-channel receiver and switch it between the tracking coils and the local coil.

The NMR signals picked up by the RF imaging coil is digitized by the transceiver module 150 and transferred to a memory module 160 in the system control 122. When an array of k-space data has been acquired in the memory module 160, an array processor 161 operates to Fourier transform the k-space data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

While a conventional MRI system may be used to implement the invention, in the preferred embodiment an MRI system which is designed to allow access by a physician is employed.

Referring particularly to FIG. 1, when an intra-operative MR imaging procedure is conducted a patient is placed in the magnet system 103 and a region of interest in the patient is aligned near the system isocenter located between the two, spaced magnet rings 140 and 142. A physician standing between magnet rings 140 and 142 has unrestricted access to the region of interest in the patient. During the procedure the patient may move, or be moved by the physician.

The images to be produced by the MRI system are prescribed by selecting an appropriate NMR imaging pulse sequence to be executed by the pulse generator 121. The location and orientation of the slices or 3D region to be imaged is also prescribed and is determined by the particular patient anatomy the physician wants to see during the procedure being performed. This location and orientation remains fixed until new commands are applied to the pulse generator 121.

The present invention employs locator coils which are attached to the patient at three distinct locations near the imaging volume and which indicate translation and rotation of the anatomy of interest. As will be described below, an NMR position measurement pulse sequence is interleaved with the image acquisitions during a scan, and the results of these position measurements are used to update the prescribed scan parameters such that the anatomy of interest remains in the field of view despite patient movement.

Figure 2:
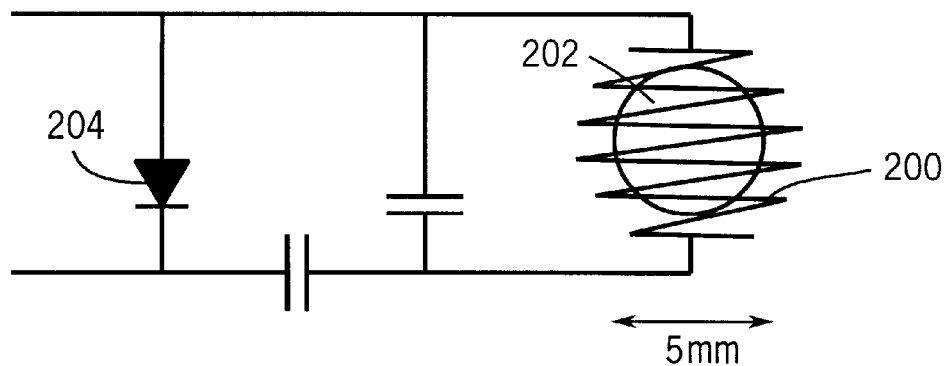
FIG. 2 is a schematic diagram of a tracking coil used to practice the preferred embodiment of the invention.

Referring particularly to FIG. 2, three small RF locator coils 200 are attached to the patient. Each of these RF locator coils 200 contains a spherical glass sample 202 (5 mm internal diameter) of water doped with $CuSO_4$ to provide a relaxation time $T_2$ of approximately 10 ms. Each sample 202 is enclosed in a tightly fitting spherically wound RF coil 200 tuned to 63.9 MHz (for 1.5 Tesla $^1$H NMR). The RF coils 200 are receive-only and include a switchable PIN diode 204 for decoupling during RF transmission by the MRI system RF body coil. These locator coils 200 are fastened to the patient at a location which moves the triangular plane defined by the locator coils 200 when the patient anatomy of interest moves.

Figure 3:
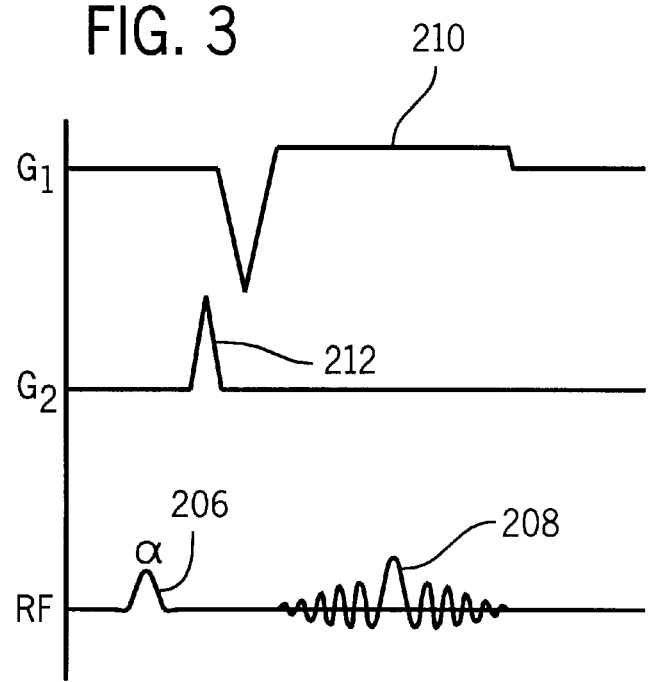
FIG. 3 is a graphic representation of an NMR pulse sequence used by the MRI system of FIG. 1 to measure the position of the tracking coil of FIG. 2.

For any given direction, the position of a single locator coil 200 relative to the gradient iso-center is measured using a position measurement NMR pulse sequence shown in FIG. 3. This gradient recalled echo pulse sequence yields a signal that is essentially a Fourier transform of a projection of the locator coil sample 202 along the readout gradient direction. Assuming that the locator coil sample 202 is small, the position of the locator coil $P_l$ is modeled by:

$$P_1 = \frac{\Delta \omega}{\gamma G_1} \quad (1)$$

where $\Delta \omega$ is the measurement angular frequency of the gradient echo signal relative to $\omega_0$, the Larmor frequency, and $G_1$ is the applied readout gradient. The three-dimensional position of each tracking coil 200 can be identified from three linearly independent gradient echoes.

In practice, the accuracy of each of these position measurements is degraded by the presence of magnetic field inhomogeneities ($\Delta B_0$) This distortion is eliminated through the acquisition of an additional gradient echo. Four tetrahedrally directed gradient echoes as described in "Real-time Position Monitoring of invasive Devices Using Magnetic Resonance" C. L. Dumoulin, et al., Magn. Reson. Med. 1993; 29:411–415, form a Hadamard encoding scheme for the coil position calculation.

Referring particularly to FIG. 3, the position measurement NMR pulse sequence is a gradient recalled echo pulse sequence in which a non-selective RF excitation pulse 206 is applied by the whole body RF coil. The flip angle α is 15, and an NMR echo signal 208 is acquired at an echo time TE=6 ms in the presence of a $G_1$ readout gradient 210. This pulse sequence is performed four times with the direction of the $G_1$ readout gradient changed in each measurement to provide the Hadamard encoding scheme described above.

A single locator coil 200 is predominantly sensitive to RF signals from its immediate physical neighborhood. However, in the presence of several such coils, coupling can occur providing larger than expected signals. Also, a surface coil is employed for imaging with the three tracking coils 200, and coupling may occur with it or the large body coil used for RF excitation. The resulting unwanted MR signals are suppressed using a dephasing gradient pulse 212 applied just prior to, and in a direction $G_2$ orthogonal to the readout gradient $G_1$. The gradient pulse 212 dephases the magnetization across large spatial structures. The remaining NMR signal 208 is principally due to small structures, such as the sample 202 to which the locator coil 200 is particularly sensitive.

Figure 4:
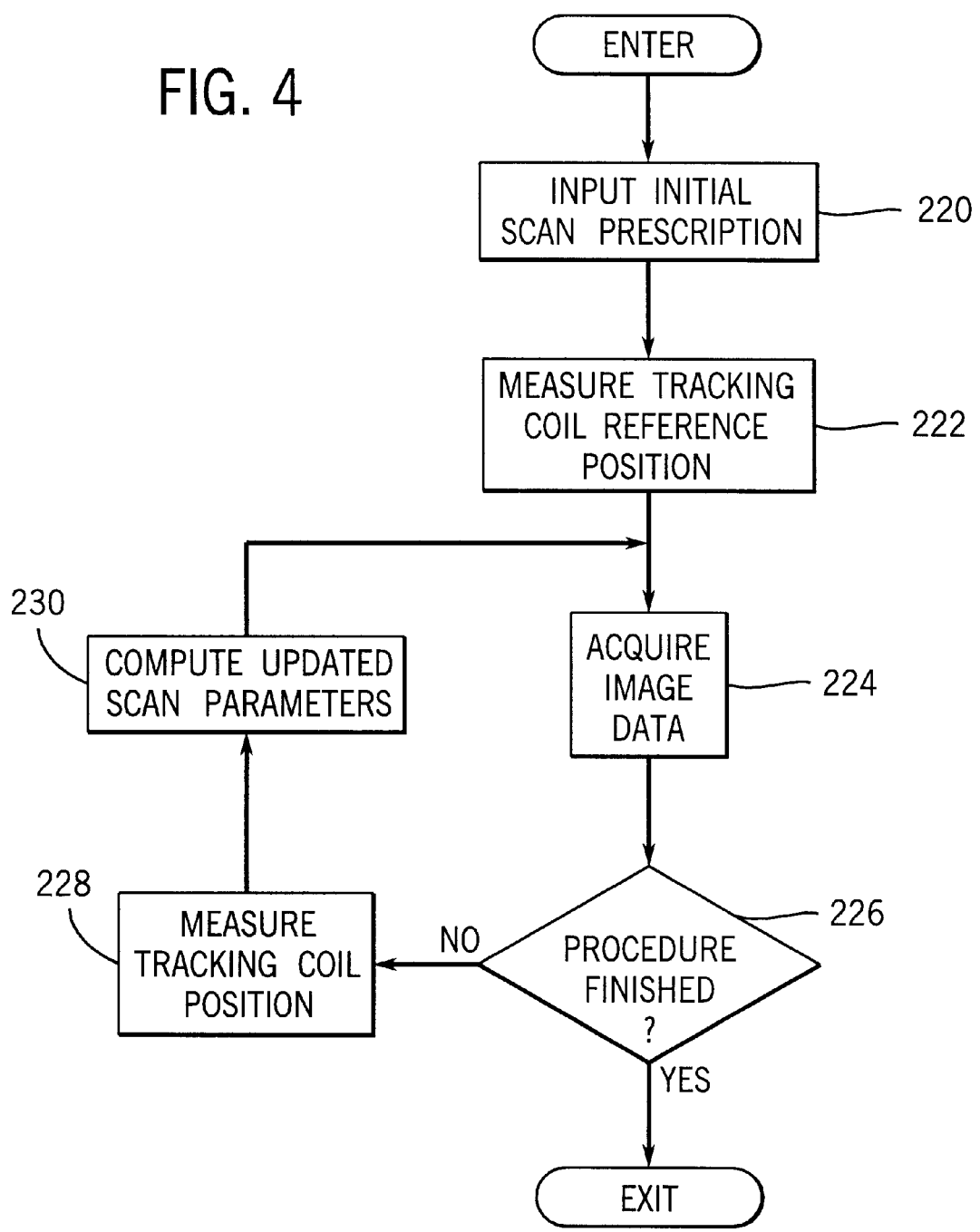
FIG. 4 is a flow chart of the preferred method used to practice the present invention.

The scan according to the preferred embodiment of the invention is carried out by a series of steps depicted in FIG. 4. When the procedure is started the operator enters the initial scan prescription as indicated at process block 220. As indicated above, this includes the selection of an appropriate NMR pulse sequence and the scan parameters that locate and orient the slice plane or 3D volume which is to be imaged.

As indicated at process block 222, when the scan has been prescribed the location of the triangular plane defined by the three tracking coils 200 is measured. This is accomplished by performing the position measurement NMR pulse sequence of FIG. 3 four times with the readout gradient $G_{j=1,2,3,4}$ tetrahedrally directed. The four acquired NMR signals 208 from each of the three tracking coils 200 are coupled to the locator system 133. Each NRM signal indicates the measured angular frequency $\Delta\omega$ produced by the corresponding tracking coil 200 and from this the locator system 133 calculates the position of the tracking coil 200 along each gradient direction $G_j$ using the above equation 1. Given the positions in each of the directions $G_{j=1,2,3,4}$, a further calculation is made to identify the Cartesian position vector of the tracking coil $p_{i=1,2,3}$ with respect to the system isocenter. This reference position is stored as a tracking coil reference vector $p_i$, one for each of the three tracking coils 200.

Referring still to FIG. 4, a loop is then entered in which a series of images are acquired until the procedure is completed. More specifically, the selected imaging pulse sequence is performed to acquire the data for a complete image as indicated at process block 224. This image data is processed in the manner described above to reconstruct an image which is displayed to the physician. If the procedure is completed, as indicated at decision block 226, the process exits. Otherwise, it loops back to acquire and display another image.

Before acquiring another image the position of the tracking coil triangle is measured as indicated at process block 228. This is accomplished in the same manner described above to measure the reference triangle position. That is, four projection acquisitions are acquired using the pulse sequence of FIG. 3 and an updated tracking coil triangle position vector $p_i'$ is calculated by the locator system 133. As indicated by process block 230, this updated position vector $p_i'$ is then used to determine the movement of the patient since the previous tracking coil measurement. This information is used by the locator system 133 to update the scan parameters such that the next image will be acquired from the same location and orientation in the patient. Consequently, the series of images that are acquired during the procedure will track with patient movements as measured by the tracking coils 200. This tracking will now be described in detail.

The tracking coils 200 and locator system 133 produce data $(p_i)$:i=1,2,3, corresponding to the position vectors of the vertices of the reference triangle (the original position of the tracking coils 200). They also produce position vectors, $(p_i')$:i=1,2,3, corresponding to the location of the updated vertices of the triangle after each image frame is acquired. Although the triangles represented by the $(p_i)$ and $(p_i')$ vectors are measured in the same reference frame, they may not be exactly geometrically similar triangles due to errors from the measurement process or deformations induced by movement of the tracking coils 200 on the subject.

A new triangle represented by the position vector $(p_i'')$:i=1,2,3 is identified as a rigid body rotation, R, of the reference triangle $(p_i)$ to a new position which minimizes the least squares (LS) condition $$\epsilon = \sum_{i=1}^{3} |p_i'' - p_i'|^2 \tag{3}$$

$$\text{where } (p_i'') = R(p_i) \qquad (i = 1, 2, 3). \tag{4}$$

In general, a rigid body transformation provides six degrees of freedom, three of these are required to provide a translation, and the remaining three specify a rotation of a certain angle about an arbitrary axis. A solution to equation (3) is accomplished in three steps. The first step shows that the translation minimizing the LS condition of equation (3) for any two arbitrary triangles identifies the position of their centroids. In the second step, it is shown that the rotational transformation leaves the two triangles coplanar. The final step provides a prescription for the in-plane rotation about the centroid of the two triangles to minimize equation (3).

For the first step, let $$r = \frac{1}{3} \sum_{i=1}^{3} p_i$$

define the centroid of the triangle $(p_i)$.

The translation, t, that minimizes the least squares condition $$\epsilon'(t) = \sum_{i=1}^{3} |p_i'' - p_i'|^2 = \sum_{i=1}^{3} |p_i + t - p_i'|^2 \tag{5}$$

aligns the centroids of the triangles. Differentiating equation (5) and searching for stationary points, we obtain $$\nabla_t \epsilon'(t) = 2 \sum_{i=1}^{3} (p_i + t - p_i') = 0. \tag{6}$$

This implies that at the minimum of equation (5) the centroid of the translated triangle satisfies $$r'' = r + t = r', \tag{7}$$

and so the centroid of the two triangles have been aligned. A corollary is that the LS rigid body transformation (including rotations) must also align the centroids of the triangles.

For the second step the LS rigid body transformation leaves the two triangles coplanar. Consider two coplanar triangles, ($p_i$) and ($p_i'$), with coincident centroids. A rotation about an in-plane axis passing through the origin can be used to move the ($p_i$) out of plane. Without loss of generality, it can be assumed that the two triangles initially lie in the XY plane with their centers at the origin. By suitable choice of axes, we may arrange that this rotation is effected about the x-axis. Let $$p_i = (p_{i1}, p_{i2}, 0) \quad (8)$$

$$p_i' = (p_{i1}', p_{i2}', 0) \quad (9)$$

$$p_i'' = (p_{i1}'', p_{i2}'', 0) = (p_{i1}, p_{i2}\cos\theta, p_{i2}\sin\theta) \quad (10)$$

That is, the triangles are coplanar if and only if $\theta = 0°$ or $\theta = 180°$. The lease squares error on the position of the two triangles as a function of rotation angle in the sense of equation (3) is:

$$\epsilon'(\theta) = \sum_{i=1}^{3} |p_i'' - p_i'|^2 \quad (11)$$

$$= \sum_{i=1}^{3} (p_{i1} - p_{i1}')^2 + (p_{i2}\cos\theta - p_{i2}')^2 + (p_{i2}\sin\theta)^2. \quad (12)$$

Finding the stationary points.

$$\frac{d\epsilon'(\theta)}{d\theta} = \sum_{i=1}^{3} 2(p_{i2}\cos\theta - p_{i2}')(-p_{i2}\sin\theta) + 2(p_{i2}\sin\theta)(p_{i2}\cos\theta) = 0 \quad (13)$$

which implies $$\sin\theta \sum_{i=1}^{3} p_{i2} p_{i2}' = 0. \quad (14)$$

Since $$\frac{d^2\epsilon'}{d\theta^2} = \cos\theta \sum_{i=1}^{3} p_{i2} p_{i2}',$$

the values of $\theta$ corresponding to the minimum are $$\sum_{i=1}^{3} p_{i2} p_{i2}' > 0 \Rightarrow \theta = 0° \quad (15)$$

$$\sum_{i=1}^{3} p_{i2} p_{i2}' < 0 \Rightarrow \theta = 180°. \quad (16)$$

In the case where $\Sigma p_{i2} p_{i2}' = 0$, $\epsilon'$ is constant for all $\theta$. Hence, although not unique, the coplanar arrangement achieves the optimal value for $\epsilon'$. In all cases, therefore, the two triangles are coplanar and we proceed to optimize the in-plane rotation.

In steps 1 and 2 it was shown that the LS rigid body transformation transforms the reference triangle $p_i$ to lie coplanar with the measured triangle $p_i'$ with their centroids aligned. The third step determines the required in-plane rotation $\phi$ to optimally fit the transformed triangle $p_i''$ to minimize equation (3).

Working in-plane, it is convenient to switch to a new notation based on complex numbers for the vertices of the triangle. The centroids of the two triangles are placed (without loss of generality) at the origin. Let $z_i$:i=1,2,3 represent the coils at the vertices of the reference triangle to be fitted, and $z_i'$:i=1,2,3 be the fixed vertices of the measured triangle with respect to arbitrary real and imaginary axes. Minimizing equation (3) is equivalent to minimizing $$\epsilon'(\phi) = \sum_{i=1}^{3} |z_i e^{j\phi} - z_i'|^2 = \sum_{i=1}^{3} (z_i e^{j\phi} - z_i')(z_i e^{j\phi} - z_i')^* \quad (17)$$

where $j = \sqrt{-1}$.

Differentiating with respect to $\phi$ and searching for the stationary points gives $$\frac{d\epsilon'(\phi)}{d\phi} = \sum_{i=1}^{3} (z_i e^{j\phi} - z_i')(jz_i e^{j\phi})^* + (jz_i e^{j\phi})(z_i e^{j\phi} - z_i')^* \quad (18)$$

$$= \sum_{i=1}^{3} (jz_i^* z_i' e^{-j\phi}) + (-jz_i z_i'^* e^{j\phi}) \quad (19)$$

$$= j\sum_{i=1}^{3} (z_i^* z_i' e^{-j\phi}) - (z_i^* z_i' e^{-j\phi})^* = 0 \quad (20)$$

This implies that $\Sigma_{i-1}^{3} (z_i^* z_i' e^{-j\phi})$ is purely real. Hence we obtain $$\phi = arg\left(\sum_{i=1}^{3} z_i^* z_i'\right) \quad (21)$$

since the other solution ($\phi+180°$) gives the maximum for $\epsilon'$. The rigid body transformation of the tracking coil triangle to a new position $p_i''$ that minimizes the least squares condition set forth in equation (3) is thus calculated.

The position data $p_i''$ from the triangular tracking array is thus used to calculate an updated scan-plane specification, compensating for the subject motion. Here, a full description of the updated scan-plane is given in terms of the measured positions of the tracking coils 200 in the tracking array.

Identification of the updated (i.e. motion corrected) scan-plane can be implemented either by explicit or implicit schemes. For an explicit system, the rigid body transformation, R, is explicitly derived from the original reference $p_i$ and updated positions $p_i'$ of the triangle. The original scan-plane prescription (position and orientation) with respect to the fixed (magnet) frame coordinates is then transformed to yield the updated scan-plane specification. For an implicit updating scheme, the position and orientation of the initial scan-plane is calculated with respect to a local reference frame based on the initial triangle position and orientation. After motion, the transformed triangle location $p_i''$ is calculated as described above. The updated scan-plane position and orientation are then calculated in terms of the new triangle frame. The two schemes are effectively equivalent, but represent different approaches to the problem.

The implementation used in the preferred embodiment uses an implicit updating scheme based upon a local coordinate system, (r, $q_i$), relative to the triangular tracking coil array. Given position vectors ($p_i$):i=1,2,3, corresponding to the position vectors of the triangle vertices, $$r = \frac{1}{3}\sum_{i=1}^{3} p_i,$$

defines the centroid of the triangle, and origin of the local coordinate system. Orthonormal basis vectors $(q_i)$:$i=1,2,3$ are constructed in the orientation of the triangle as follows:

$$q_{1^+} = \frac{p_1 - r}{|p_1 - r|} \quad (22)$$

$$q_3 = \frac{(p_1 - r) \times (p_2 - r)}{|(p_1 - r) \times (p_2 - r)|} \quad (23)$$

$$q_2 = q_3 \times q_1. \quad (24)$$

Note that $q_i \neq 0$ if the $(p_i)$ does not collapse into a single point. The vectors are clearly a right handed orthonormal set.

Let the prescribed scan-plane have center c, with orthonormal orientation vectors $(e_i)$: these values are known from the pulse sequence parameters and correspond to the read, phase encode and slice directions. The original scan-plane prescription can be expressed in terms of the local coordinate system of the reference triangle $p_i$:

$$c = r + \sum_{i=1}^{3} \lambda_i q_i \quad (25)$$

$$e_i = \sum_{j=1}^{3} \mu_{ij} q_j \quad (26)$$

where the coefficients are given by $$\lambda_i = (c-r) \cdot q_i \quad (27)$$

and $$\mu_{ij} = e_i \cdot q_j. \quad (28)$$

Updated scan-plane parameters are generated as follows. The updated position data for the triangular tracking array, $(p_i')$, are obtained and used to fit a rigid body transformed copy of the reference triangle $(p_i'')$ from which a new local coordinate system $(r'', q_i'')$ can be generated as described above. The new scan-plane is calculated from the new local coordinate system using the coefficients $(\lambda_i)$, $(\mu_{ij})$ and the centroid, $r'' = \Sigma p''_i$, of the triangle.

$$c'' = r'' + \sum_{i=1}^{3} \lambda_i q_i'' \quad (29)$$

$$e_i'' = \sum_{j=1}^{3} \mu_{ij} q_j'' \quad (30)$$

Note that the use of the fitted triangle coordinates $(p_i'')$ rather than the $(p_i')$ may not be necessary in practice. The use of the former is theoretically superior as it gives equal weight to each of the newly measured position data. The use of the $(p_i')$ directly introduces bias through the arbitrary choice of $(p_1)$ and $(p_2)$ as the defining directions for the local orthonormal basis set.

We claim:

1. A method for performing a procedure with an MRI system in which a series of images are acquired from a region of interest in a subject, the steps comprising:
   a) placing an array of tracking coils on the subject;
   b) acquiring an NMR image using an NMR imaging pulse sequence prescribed by a set of scan parameters which image the region of interest;
   c) measuring the location of the tracking coils using an NMR position measurement pulse sequence;
   d) updating the scan parameters to track the movement of the subject using the measured tracking coil locations; and
   e) repeating steps b), c) and d) until the procedure is completed.

2. The method as recited in claim 1 which includes measuring the location of the tracking coils using the NMR position measurement pulse sequence and calculating a reference position before step b) is performed.

3. The method as recited in claim 2 wherein the step of placing an array of tracking coils on the subject comprises placing three tracking coils on the subject.

4. The method as recited in claim 1 in which the NMR position measurement pulse sequence is performed by:
   i) applying an rf excitation pulse that produces transverse magnetization;
   ii) applying a readout magnetic field gradient $G_1$; and
   iii) acquiring an NMR signal from each tracking coil in the tracking coil array.

5. The method as recited in claim 4 in which the NMR position measurement pulse sequence is repeated to acquire a plurality of NMR signals from each tracking coil and the direction of the readout magnetic field gradient $G_1$ is changed for each acquisition.

6. The method as recited in claim 5 in which the NMR position measurement pulse sequence is performed four times and the readout magnetic field gradient $G_1$ is tetrahedrally directed during the four successive acquisitions.

7. The method as recited in claim 4 which includes applying a dephasing magnetic field gradient $G_2$ prior to step iii), wherein the dephasing magnetic field $G_2$ is substantially perpendicular to the readout magnetic field gradient $G_1$.

* * * * *